United States Patent [19]
Kobayashi

[11] Patent Number: 5,952,710
[45] Date of Patent: *Sep. 14, 1999

[54] SEMICONDUCTOR DEVICE AND METHOD OF MANUFACTURING SAME

[75] Inventor: Harufumi Kobayashi, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/812,932

[22] Filed: Mar. 4, 1997

[30] Foreign Application Priority Data

Oct. 9, 1996 [JP] Japan ................................ 8-268063

[51] Int. Cl.[6] .................................................. H01L 23/495
[52] U.S. Cl. ........................ 257/666; 257/676; 257/784
[58] Field of Search .................................. 257/666, 676, 257/784

[56] References Cited

FOREIGN PATENT DOCUMENTS

| 4-94156 | 3/1992 | Japan | 257/666 |
| 4-199551 | 7/1992 | Japan | 257/666 |
| 5-29527 | 2/1993 | Japan | 257/666 |

*Primary Examiner*—Peter Toby Brown
*Assistant Examiner*—Roy Potter
*Attorney, Agent, or Firm*—Jones, Volentine, Steinberg, & Whitt, L.L.P.

[57] ABSTRACT

Of ends of a plurality of inner leads disposed around a semiconductor chip shaped substantially in the form of a rectangle, the ends of the inner leads, which correspond to the corners of the rectangle, are provided so as to approach in the direction of the semiconductor chip. Owing to the provision referred to above, bonding wires for connecting electrical connections between the semiconductor chip and the ends of the inner leads can be prevented from drifting upon a mold process.

8 Claims, 5 Drawing Sheets

SEMICONDUCTOR DEVICE AND METHOD OF MANUFACTURING SAME

BACKGROUND OF THE INVENTION

1. Field of the Invention

This invention relates to a semiconductor device and a method of manufacturing the semiconductor device.

2. Description of the Related Art

A hermetic seal and a resin or plastic seal have been known as seals for protecting a semiconductor device from dust, contamination and a mechanical breakdown. With improvements in passivation technology of a semiconductor chip and improvements in the characteristic of a sealing resin, there has recently been a tendency to widely use a resin seal package. This type of resin seal package is low in cost and suitable for mass production.

However, when the entire length of each of bonding wires 9 for providing electrical connections between electrode pads of a semiconductor chip 3 and a lead frame 5 reaches 3 mm or more, wire flows or drifts were apt to occur in a conventional resin or plastic molded type semiconductor device 13. In FIGS. 4 and 5, the direction of flow of a mold resin 11 in a mold process is indicated by the arrows in the drawings. Although described in detail later, each wire is deformed in the direction in which the mold resin 11 flows. This wire deformation is called "wire flow or drift".

SUMMARY OF THE INVENTION

With the foregoing in view, it is an object of the present invention to provide a semiconductor device capable of minimizing a wire drift and a method of manufacturing the semiconductor device and to improve the yield and reliability of the semiconductor device.

According to one aspect of the present invention, for achieving the above objects, there is provided a semiconductor device comprising:

a semiconductor chip shaped substantially in the form of a rectangle;

a plurality of first inner leads having ends placed on lines spaced by predetermined distances from respective four sides of the rectangle;

a plurality of second inner leads having ends provided at positions opposed to the four corners of the rectangle, the ends thereof being disposed so as to be close to the semiconductor chip as compared with ends of the respective one inner leads of the plurality of first inner leads, which are adjacent to the plurality of second inner leads;

a plurality of pad electrodes placed side by side with the four sides so as to fall within the semiconductor chip; and bonding wires for respectively connecting the plurality of pads to the plurality of first or second inner leads.

According to another aspect of the present invention, for achieving the above objects, there is provided a method of manufacturing a semiconductor device, comprising the following steps:

a) a step for preparing a lead frame having a semiconductor chip shaped substantially in the form of a rectangle, a plurality of first inner leads whose ends are respectively disposed on lines spaced by predetermined distances from respective four sides of the rectangle, and a plurality of second inner leads whose ends are respectively provided at positions opposed to the four corners of the rectangle and disposed so as to be close to the semiconductor chip as compared with ends of the respective one inner leads of the plurality of first inner leads, which are adjacent to the plurality of second inner leads;

b) a step for connecting a plurality of pad electrodes placed side by side with the four sides so as to fall within the semiconductor chip and the plurality of first or second inner leads to one another by bonding wires; and c) a step for sealing the semiconductor chip and the inner leads with a mold resin.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying wings in which:

FIG. 2 is an enlarged view of an X portion shown in FIG. 1a;

DETAILED DESCRIPTION OF THE PREFERRED EMBODIMENTS

Preferred embodiments of a lead frame according to the present invention and a semiconductor device using the lead frame will hereinafter be described in detail with reference to the accompanying drawings.

Figure 1A:
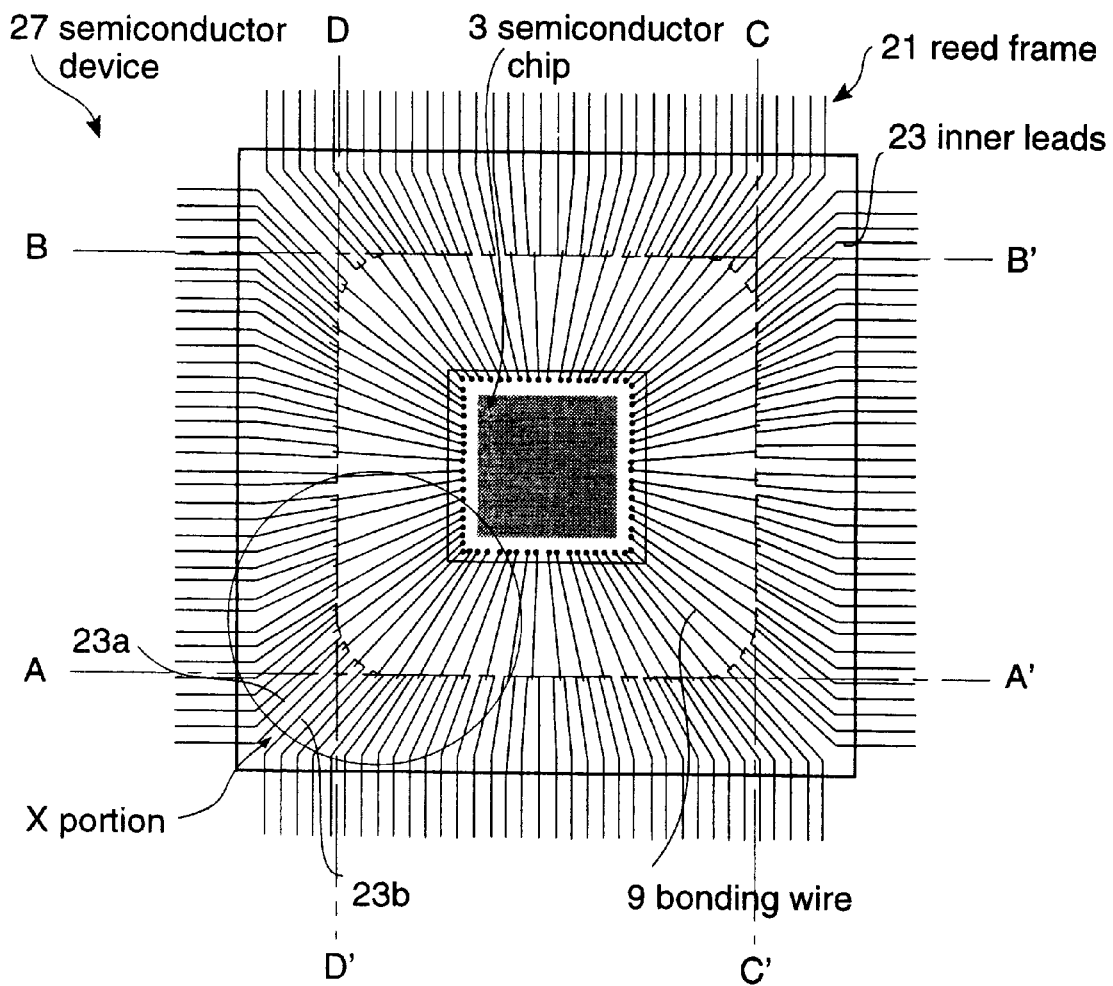
FIG. 1a is a plan view showing a principal part of a semiconductor device according to the present invention.
Figure 1B:
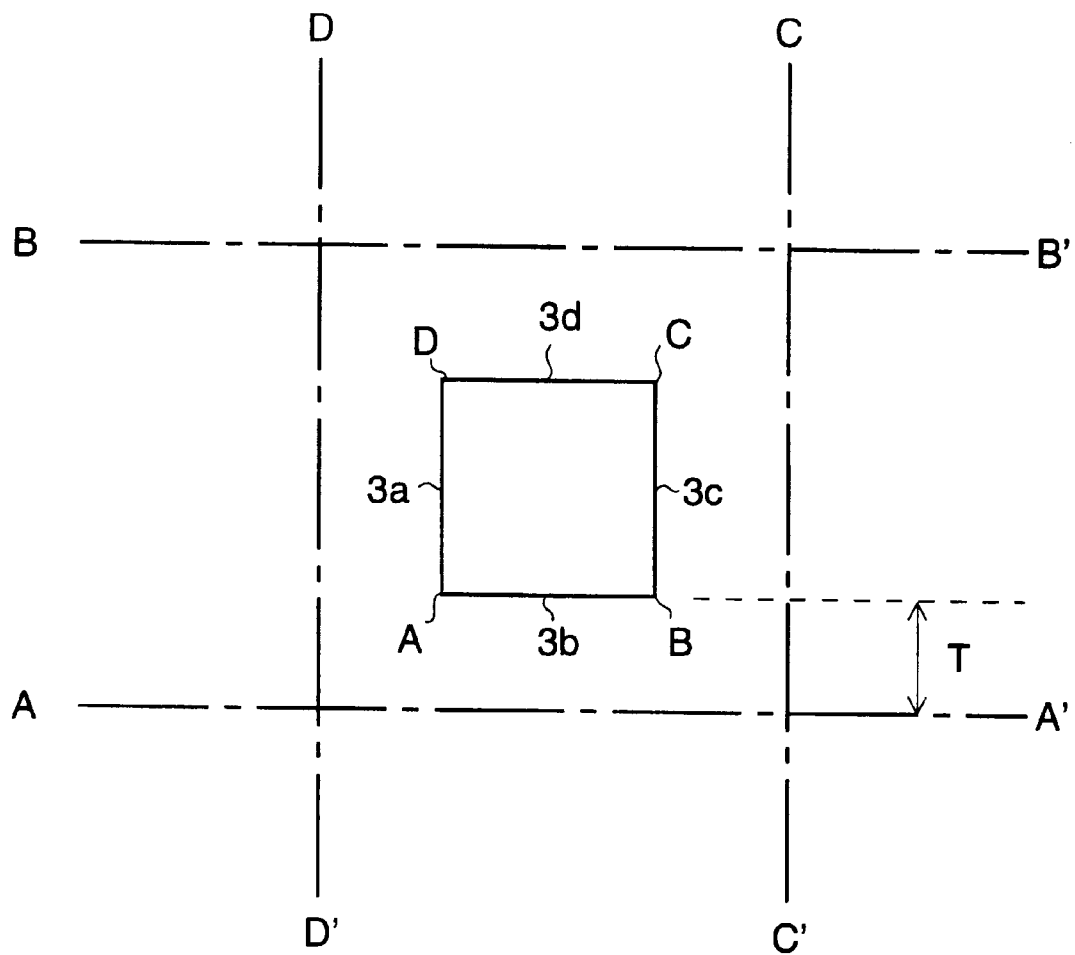
FIG. 1b is a view for describing the relationship of positions between a semiconductor chip of the semiconductor device shown in FIG. 1a and of inner leads thereof.
Figure 2:
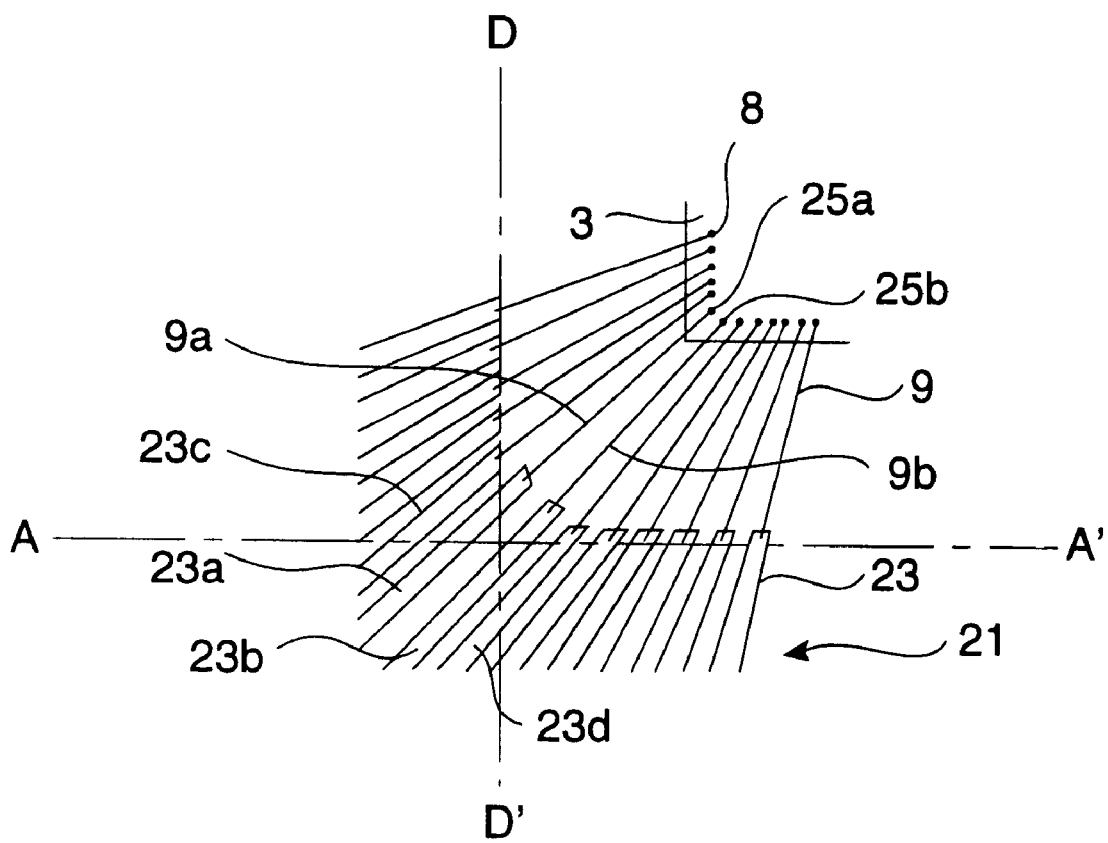

FIG. 1a is a plan view showing a fragmentary portion of a semiconductor device according to the present invention. FIG. 1b is a view for explaining the relationship of positions between a semiconductor chip 3 and ends of a lead frame 21. FIG. 2 is an enlarged view of an X portion shown in FIG. 1a.

As shown in FIG. 1a, ends of inner leads are disposed at intervals around the semiconductor chip 3. Electrode pads 8 are provided side by side at edge portions of the semiconductor chip 3 along respective sides 3a, 3b, 3c and 3d. Most ends (corresponding to ends of a plurality of first inner leads) of inner leads 23 are provided side by side on lines A–A', B–B', C–C' and D–D'. These lines A–A', B–B', C–C' and D–D' are respectively opposed to the respective sides 3b, 3c, 3d and 3a of the semiconductor chip 3 at predetermined intervals T (see FIG. 1b). Bonding wires 9 provides electrical connections between the ends of the inner leads and the electrode pads 8.

As shown in FIG. 2, ends (corresponding to ends of a plurality of second inner leads) of inner leads 23a and 23b, which are respectively opposed to electrode pads 25a and 25b provided at the corner A of the semiconductor chip 3, are disposed so as to approach in the direction of the semiconductor chip 3 as seen from inner leads 23c and 23d adjacent to the inner leads 23a and 23b. Ends of respective inner leads respectively opposed to other corners B, C and D of the semiconductor chip 3 are disposed in the same manner as described above.

Figure 3:
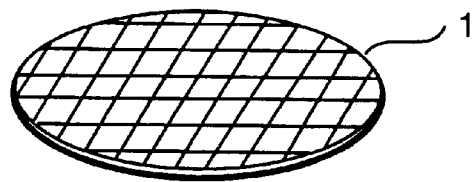
FIG. 3 is an view for describing a method of manufacturing a semiconductor device, according to the present invention.
Figure 3:
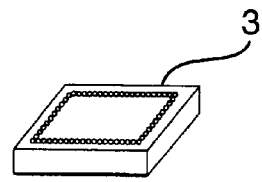
Figure 3:
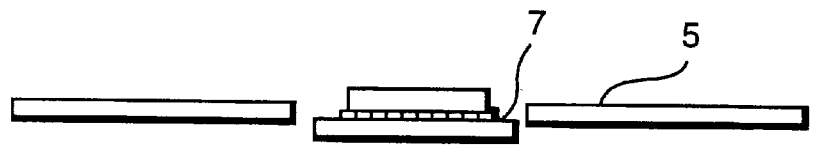
Figure 3:
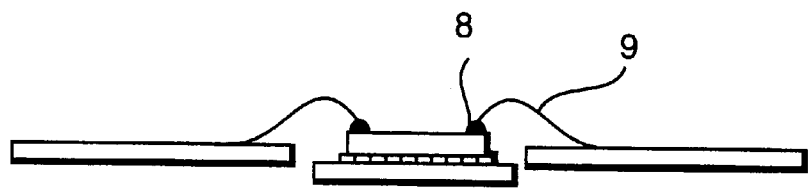
Figure 3:
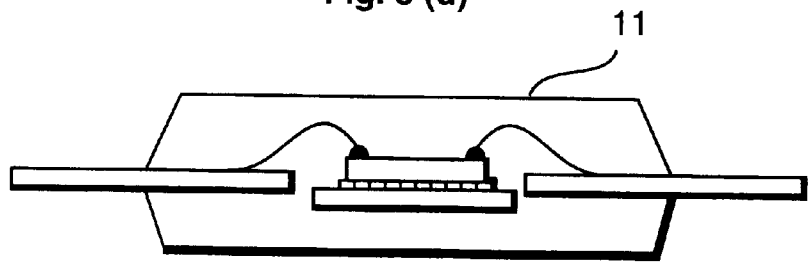
Figure 3:
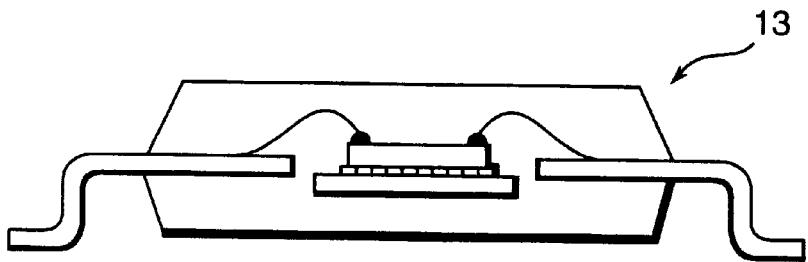
Figure 4:
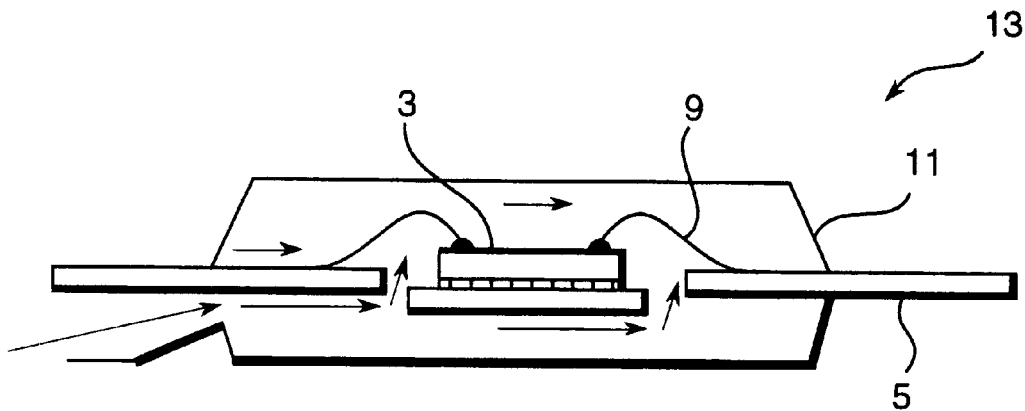
FIG. 4 is a view (cross-sectional view) for describing the direction of flow of a mold resin during a mold process.

A method of manufacturing a resin or plastic molded type semiconductor device 27 using the lead frame 21 will now be described with reference to FIG. 3.

A diffusion-completed wafer 1 (see FIG. 3(a)) is first divided into semiconductor chips 3 in a scribe process step (see FIG. 3(b)). One of the divided semiconductor chips 3 is fixed onto a lead frame 5 with silver paste 7 in a diebond process step (see FIG. 3(c)). Next, electrode pads 8 of the semiconductor chip 3 and the lead frame 5 are electrically connected to one another by bonding wires 9 (gold lines) in a wire bond process step (see FIG. 3(d)). Thereafter, the resultant product is sealed with a mold resin 11 in a mold process step (see FIG. 3(e)). Next, the lead frame 5 is processed into a predetermined shape in a lead processing step (see FIG. 3(f)). A resin molded type semiconductor device 13 is formed in accordance with the above-described process steps.

Incidentally, an Fe—Ni alloy, Cu or the like can be used as the lead frame 21. Further, Al, Au, Cu or the like can be used as the bonding wires 9 and epoxy, silicon, phenol or the like can be used as the mold resin.

A description will be made of a case in which, for example, a transfer mold method is adopted as a resin-sealing method.

Namely, a resin added with an amine or phenol curing agent is used with an epoxy resin as a base. Next, the resin is injected or poured into a mold at temperatures ranging from 160° C. to 180° C. under pressures ranging from 49 MPa to 98 MPa over a period of 60 to 120 seconds, followed by being subjected to postcuring for several hours at temperatures ranging from 150° C. to 180° C., whereby the resin is hardened.

In the semiconductor device using the inner leads 23 referred to above, the inner leads (23a and 23b) of the plurality of inner leads 23, which are electrically connected to the electrode pads (25a and 25b) at the corner (e.g., A) of the semiconductor chip 3, are formed so as to be close to the semiconductor chip 3 as compared with the inner leads 23c and 23d adjacent to the above inner leads. Therefore, the bonding wires 9 electrically connected to the inner leads 23a and 23b are shorter than those electrically connected to the inner leads 23c and 23d adjacent to the inner leads 23a and 23b.

Figure 5:
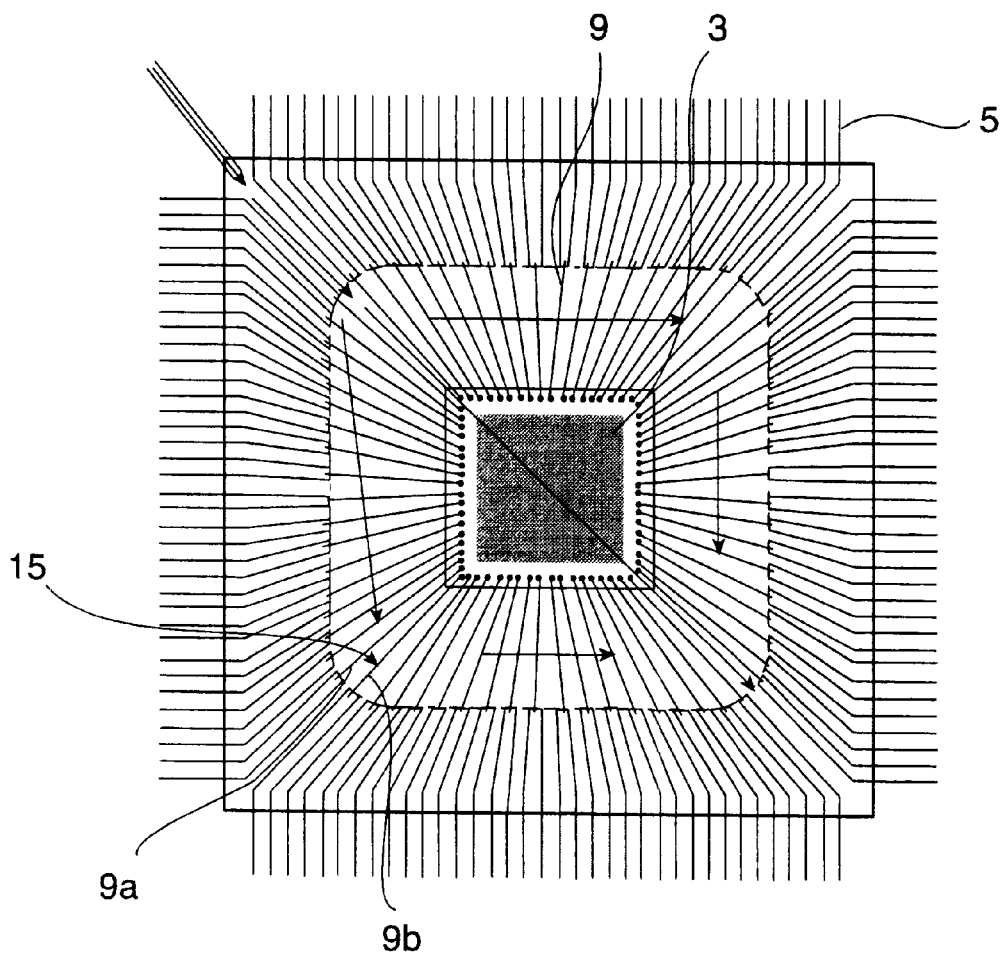
FIG. 5 is a view (plan view) for describing the direction of flow of the mold resin during the mold process.

When ends of inner leads respectively electrically connected to electrode pads at the corners of a semiconductor chip 3 are formed on their corresponding lines A–A', B–B', C–C' and D–D' of FIG. 1b as shown in FIG. 5, the distance between the end of each inner lead 23 and each electrode pad reaches a maximum at each corner of the semiconductor chip.

Thus, a channel or path along which the mold resin may flow, has the maximum cross-section at each corner of the semiconductor chip upon resin injection. Since the interval between each of electrode pads at the corners and each of inner leads thereat was a maximum in the conventional semiconductor device in addition to this, bonding wires 9 for providing electrical connections between the electrode pads and the inner leads were also maximized in length at the corners. As a result, wire flows or drifts (9b) occurred because the bonding wires 9 at the corners were subjected to strong resistance or opposition from the injected mold resin.

In the invention of the present application to the contrary, it is apparent from FIG. 2 that since the bonding wires 9a and 9b at each corner become shorter than the bonding wires 9 provided adjacent thereto, the resistance to the bonding wires 9a and 9b from the injected mold resin also decreases, the rigidity of each bonding wire itself is improved and the wire drift is hard to occur.

Thus, since the inner leads 23a and 23b at the corner are formed so as to be close to the semiconductor chip 3 as compared with the inner leads 23c and 23d adjacent thereto, the use of the lead frame 21 can provide the shortening of the entire length of each boding wire 9 at the corner.

Further, according to the semiconductor device 27 using the read frame 21, the bonding wires 9 at each corner of the semiconductor chip 3 can be shortened. Thus, the resistance to each molding wire from the injected resin upon injection of the mold resin can be reduced and the deformation of each bonding wire 9 can be minimized. It is also possible to prevent chute from occurring due to disconnection or a wire flow or drift. As a result, the yield and reliability of the semiconductor device can be improved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:

a semiconductor chip having four sides and four corners;

a plurality of electrode pads, said pads formed along at least one of said sides and at one or more of said corners of said semiconductor chip;

a plurality of inner leads; and a plurality of bonding wires, each of said wires connecting one of said electrode pads to one of said inner leads, wherein one of said bonding wires connecting one of said electrode pads formed at said one or more corners of said semiconductor chip to one of said inner leads has a length which is shorter than a length of an adjacent bonding wire.

2. The semiconductor device of claim 1, wherein the bonding wires are composed of Al.

3. The semiconductor device of claim 1, wherein the bonding wires are composed of Au.

4. The semiconductor device of claim 1, wherein the bonding wires are composed of Cu.

5. A semiconductor device comprising:

a semiconductor chip having four sides and four corners;

a plurality of electrode pads disposed along at least one side and at one or more corners of said semiconductor chip;

a plurality of inner leads; and a plurality of wires connecting each of said electrode pads to one of said inner leads, wherein a distance between an electrode pad disposed at one of said corners of said semiconductor chip and an end of one of said inner leads connected with said electrode pad disposed at said one corner, is less than a distance between an electrode pad disposed adjacent to said electrode pad disposed at said one of said corners of said semiconductor chip and an end of one of said inner leads connected with said electrode pad disposed adjacent to said electrode pad disposed at said one or said corners of said semiconductor chip.

6. The semiconductor device of claim 5, wherein the bonding wires are composed of Al.

7. The semiconductor device of claim 5, wherein the bonding wires are composed of Au.

8. The semiconductor device of claim 5, wherein the bonding wires are composed of Cu.

* * * * *